(12) United States Patent
Yang et al.

(10) Patent No.: US 9,786,320 B2
(45) Date of Patent: Oct. 10, 2017

(54) SYSTEMS AND METHODS FOR MISSED MEDIA SECTOR ALIGNMENT

(71) Applicant: Avago Technologies General IP (Singapore) Pte. Ltd., Singapore (SG)

(72) Inventors: Yuqing Yang, Shanghai (CN); Shaohua Yang, San Jose, CA (US)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 0 days.

(21) Appl. No.: 15/000,088

(22) Filed: Jan. 19, 2016

(65) Prior Publication Data

US 2017/0206926 A1    Jul. 20, 2017

(51) Int. Cl.
| | |
|---|---|
| G11B 5/02 | (2006.01) |
| G11B 20/18 | (2006.01) |
| H03M 13/11 | (2006.01) |
| H03M 13/17 | (2006.01) |
| G11B 5/596 | (2006.01) |
| G11B 20/12 | (2006.01) |
| G11B 5/012 | (2006.01) |
| G11B 20/14 | (2006.01) |

(52) U.S. Cl.
CPC ............ G11B 20/18 (2013.01); G11B 5/02 (2013.01); G11B 5/59616 (2013.01); H03M 13/114 (2013.01); H03M 13/17 (2013.01); *G11B 5/012* (2013.01); *G11B 2020/1287* (2013.01); *G11B 2020/1476* (2013.01)

(58) Field of Classification Search
None
See application file for complete search history.

(56) References Cited

U.S. PATENT DOCUMENTS

| | | |
|---|---|---|
| 7,499,238 B2 | 3/2009 | Annampedu |
| 8,174,949 B2 | 5/2012 | Ratnakar Aravind |
| 8,687,301 B1 | 4/2014 | Zhang et al. |

*Primary Examiner* — Brian Butcher
(74) *Attorney, Agent, or Firm* — Sheridan Ross P.C.

(57) ABSTRACT

A system includes a first sync mark detector circuit operable to apply a first sync mark detection algorithm to search a received media sector and overhead for a second sync mark after a failure to identify a first sync mark. A second sync mark detector circuit operable to apply a second sync mark detection algorithm to search the received media sector and overhead for the second sync mark. An anchor point identification circuit identifies an anchor point in the received media sector. A retry controller circuit causes a re-read of the received media sector and overhead when the first sync mark detector circuit fails to identify the first sync mark, and aligns the received media sector to yield an aligned media sector. A data processing circuit recovers an original user data set from the aligned media sector.

20 Claims, 6 Drawing Sheets

SYSTEMS AND METHODS FOR MISSED MEDIA SECTOR ALIGNMENT

FIELD OF THE INVENTION

Systems and methods relating generally to data processing, and more particularly to recovering data in a data processing system.

BACKGROUND

Processing a data set from a storage medium typically involves performing a data synchronization utilizing a sync mark within the received data stream. acquisition process to synchronize to a received data set. This timing acquisition process utilizes a sync mark within the data stream. Where in some cases the sync mark is missed, the ability to recover the data corresponding the sync mark is complicated. Such complications may include, for example, aligning individual codewords for averaging with other reads of the same individual codewords which can incur significant area and processing penalties, and at times is altogether impossible.

Hence, for at least the aforementioned reasons, there exists a need in the art for advanced systems and methods for accessing data from a storage medium.

SUMMARY

Systems and methods relating generally to data processing, and more particularly to recovering data in a data processing system.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1b is a block diagram of a storage medium and a sector data scheme storing the media sector and overhead discussed in relation to FIG. 1a;

DETAILED DESCRIPTION OF SOME EMBODIMENTS

Figure 1A:
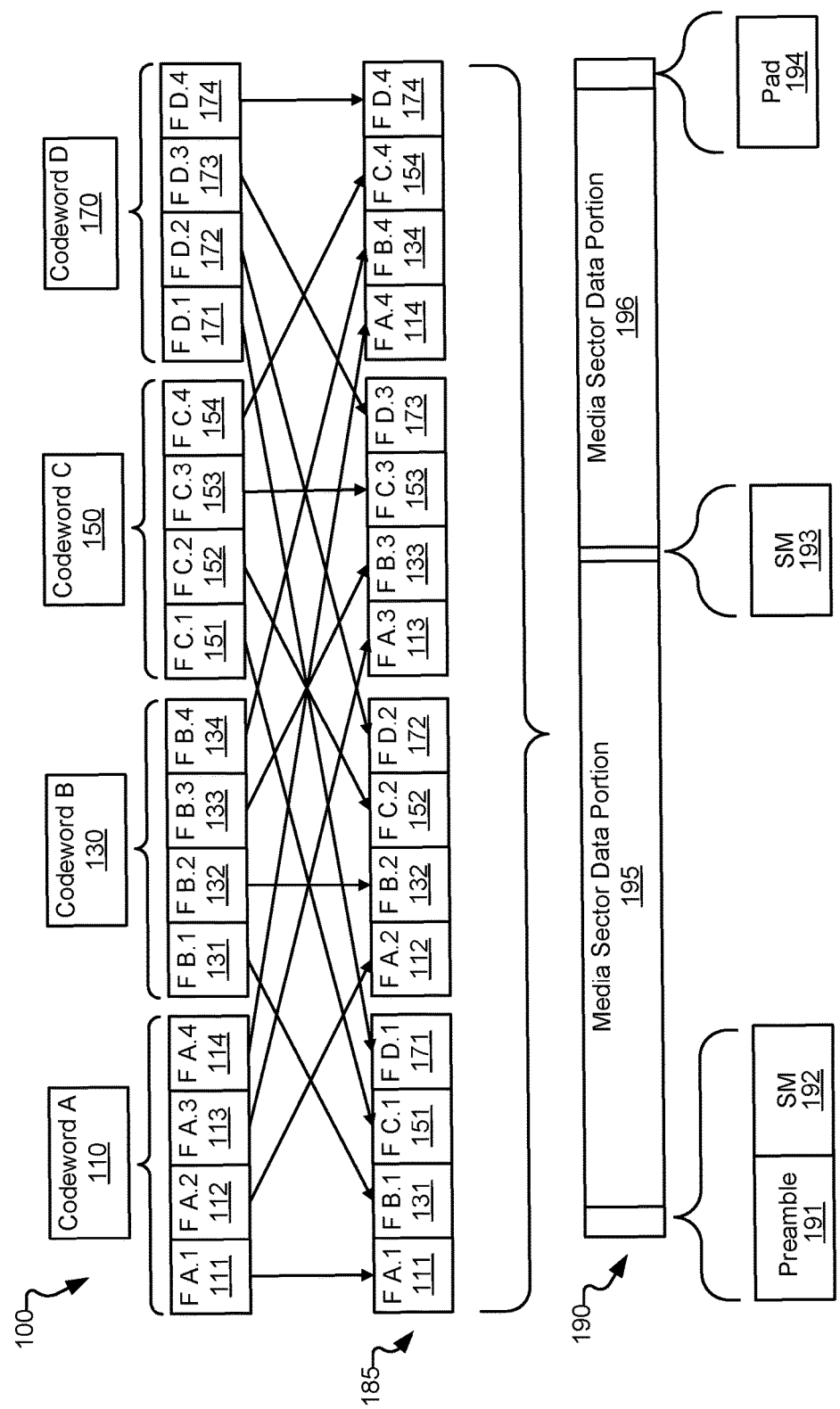
FIG. 1a graphically depicts the relationship between individual codewords, a media sector, and a storage sector including the media sector and overhead data that may be used in relation to one or more embodiments of the present inventions.

Systems and methods relating generally to data processing, and more particularly to recovering data in a data processing system.

Various embodiments of the present inventions provide data processing systems that include: a first sync mark detector circuit, a second sync mark detector circuit, an anchor point identification circuit, a retry controller circuit, and a data processing circuit. The first sync mark detector circuit is operable to apply a first sync mark detection algorithm to search a received media sector and overhead for a second sync mark after a failure to identify a first sync mark, where the received media sector includes a first fragment set corresponding to a first codeword, a second fragment set corresponding to a second codeword, and wherein the first fragment set is shuffled with the second fragment set to yield an intermixed fragment set. The second sync mark detector circuit is operable to apply a second sync mark detection algorithm to search the received media sector and overhead for the second sync mark, where the second sync mark detection algorithm is more robust than the first sync mark detection algorithm. The anchor point identification circuit is operable to identify an anchor point in the received media sector. The retry controller circuit is operable to cause a re-read of the media sector and overhead when the first sync mark detector circuit fails to identify the first sync mark, and to align the media sector to a forced sync mark at a location calculated based upon a first location of the anchor point and a second location of the second sync mark to yield an aligned media sector. The data processing circuit is operable to recover an original user data set from the aligned media sector. The second location of the second sync mark may be either an actual location where the second sync mark was identified, or a likely location where the second sync mark was within a synchronization window.

In various instances of the aforementioned embodiments, the data processing circuit includes: a data detector circuit, a codeword gathering circuit, and a data decoder circuit. The data detector circuit is operable to apply a data detection algorithm to an equalized output corresponding to the aligned media sector to yield a detected output. The codeword gathering circuit is operable to un-shuffle the intermixed fragment set represented by the detected output to yield the first codeword and the second codeword. The data decoder circuit is operable to apply a data decoding algorithm to the first codeword and the second codeword.

Other embodiments of the present inventions provide methods for data processing that include receiving a media sector including: a first fragment set corresponding to a first codeword a second fragment set corresponding to a second codeword. The first fragment set is shuffled with the second fragment set to yield an intermixed fragment set. The methods further include: failing to identify both a first sync mark and a second sync mark associated with the media sector; identifying an anchor point within the media sector at an anchor location; using a sync mark identification circuit to re-identify the second sync mark at a second sync mark location, where the second sync mark location may be either an actual location where the second sync mark was identified, or a likely location of the second sync mark; using the anchor location and the second sync mark location to calculate a first sync mark location; re-reading the entire media sector from the storage medium to yield a re-read media sector, and aligning the entire re-read media sector to the first sync mark location to yield an aligned media sector; and processing the aligned media sector using a data detector circuit and a data decoder circuit to yield user data, wherein the user data was originally encoded to yield the first codeword and the second codeword.

Turning to FIG. 1a, a number of individual codewords (i.e., codeword A 110, codeword B 130, codeword C 150, and codeword D 170) are shown that are fragmented and reassembled into a media sector 185 to which overhead data is added to yield a sector data set 190 for storage to a storage medium. Each of individual codewords 110, 130, 150, 170 is comprised of a user data set that was encoded and thus includes various encoding data applicable to the corresponding user data set. In some cases, individual codewords 110, 130, 150, 170 are low density parity check (LDPC) codewords that include both a set of user data and parity data generated from the set of user data. As shown, each of individual codewords 110, 130, 150, 170 are divided into four fragments. In particular, codeword A 110 is divided into four fragments indicated as a fragment A.1 111, a fragment A.2 112, a fragment A.3 113, and a fragment A.4 114; codeword B 130 is divided into four fragments indicated as a fragment B.1 131, a fragment B.2 132, a fragment B.3 133, and a fragment B.4 134; codeword C 150 is divided into four fragments indicated as a fragment C.1 151, a fragment C.2 152, a fragment C.3 153, and a fragment C.4 154; codeword D 170 is divided into four fragments indicated as a fragment D.1 171, a fragment D.2 172, a fragment D.3 173, and a fragment D.4 174.

The fragments of individual codewords 110, 130, 150, 170 are shuffled to yield media sector 185. Such shuffling avoids sustaining the impact of, for example, a media defect on any single individual codeword. By using shuffling to distribute the impact, encoding included with other fragments of an individual codeword may be used to recover the user data from the codeword even where one fragment is negatively impacted. In particular, media sector 185 includes the following fragment order: fragment A.1 111, fragment B.1 131, fragment C.1 151, fragment D.1 171, fragment A.2 112, fragment B.2 132, fragment C.2 152, fragment D.2 172, fragment A.3 113, fragment B.3 133, fragment C.3 153, fragment D.3 173, fragment A.4 114, fragment B.4 134, fragment C.4 154, and fragment D.4 174.

Media sector 185 is augmented with various overhead data to yield a media sector plus overhead 190. Media sector plus overhead 190 includes, but is not limited to, a preamble 191, a first sync mark 192, a second sync mark 193 and a pad 194. A first portion of media sector 185 is included between sync mark 192 and sync mark 193 as media sector data portion 195, and a second portion of media sector 185 is included between sync mark 193 and pad 194 as media sector data portion 196. The first and second sync marks 192, 193 are used for aligning data, and thus as part of recovering the media sector into which the sync marks are incorporated. It should be noted that while the aforementioned media sector plus overhead 190 is described as including shuffled fragments of four codewords that two or more codewords may be included. Further, while the codewords are described as being divided into four fragments, two or more fragments may be used.

Figure 1B:
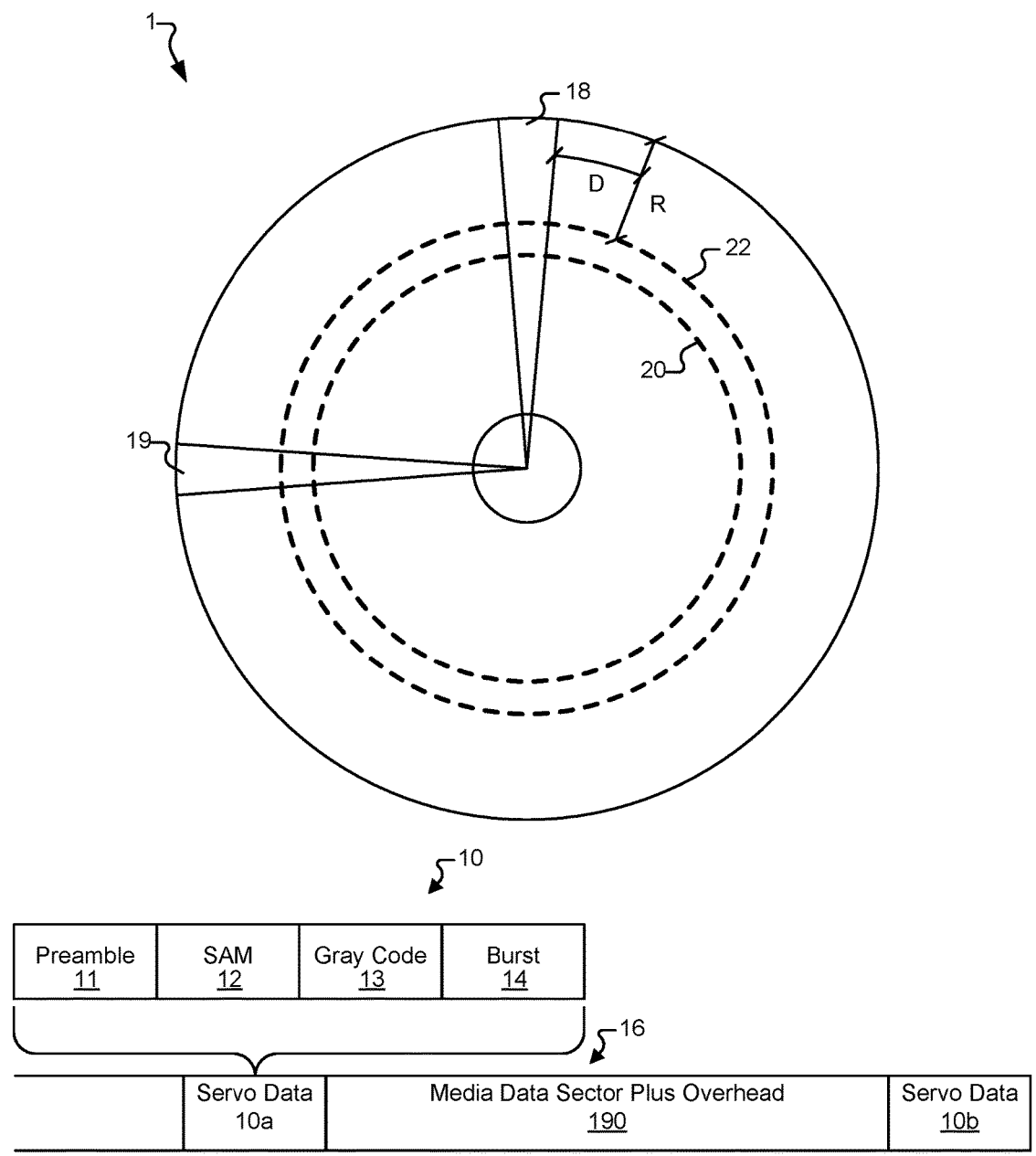

Turning to FIG. 1b, a storage medium 1 is shown with two exemplary tracks 20, 22 that are adjacent to one another and indicated as dashed lines. The tracks are divided into sector regions by servo data written within wedges 19, 18. These wedges include servo data 10 that are used for control and synchronization of a read/write head assembly over a desired location on storage medium 1. In particular, this servo data generally includes a preamble pattern 11 followed by a sector address mark 12 (SAM). Sector address mark 12 may include wedge identification information followed by the SAM. Sector address mark 12 is followed by a Gray code 13, and Gray code 13 is followed by burst information 14. Gray code 13 may include track identification information. It should be noted that while two tracks and two wedges are shown, hundreds of each would typically be included on a given storage medium. Further, it should be noted that a servo data set may have two or more fields of burst information. Yet further, it should be noted that different information may be included in the servo fields such as, for example, repeatable run-out information that may appear after burst information 14. Between the servo data bit patterns 10a and 10b, a user data region 16 includes at least a portion of media sector plus overhead 190 discussed above in relation to FIG. 1a.

In operation, storage medium 1 is rotated in relation to a sensor that senses information from the storage medium. In a read operation, the sensor would sense servo data from wedge 19 (i.e., during a servo data period) followed by user data from a user data region between wedge 19 and wedge 18 (i.e., during a user data period) and then servo data from wedge 18. When reading data in user data region 16, synchronization to the data is done through use of the overhead data. In a write operation, the sensor would sense servo data from wedge 19 then write data to the user data region between wedge 19 and wedge 18. Then, the sensor would be switched to sense a remaining portion of the user data region followed by the servo data from wedge 18. Of note, wedges 18, 19 follow arcs corresponding to the geometry of an arm and pivot as is known in the art.

Figure 2:
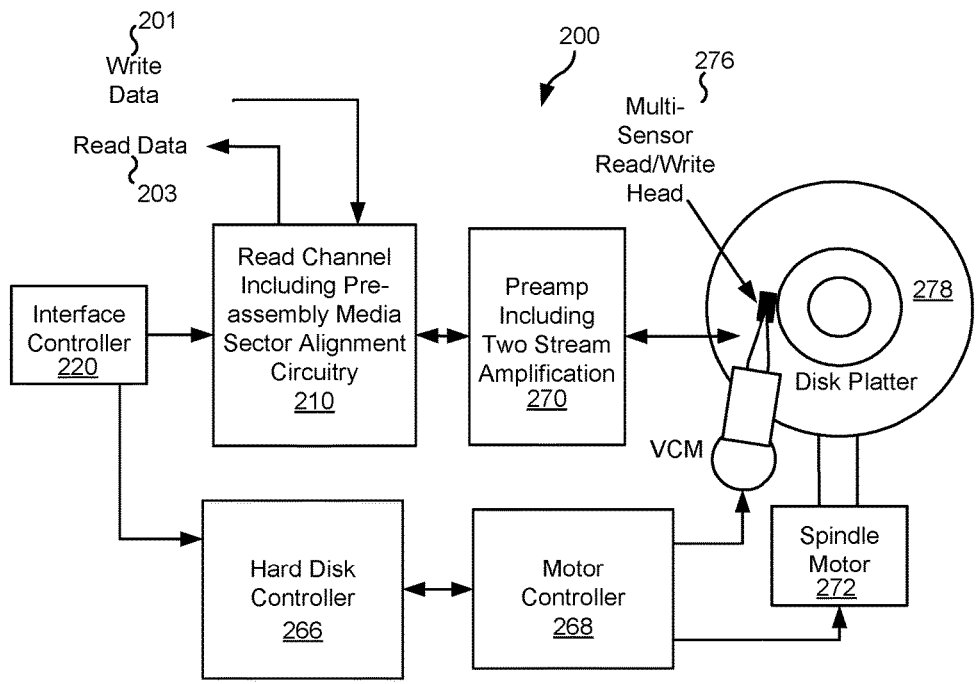
FIG. 2 is a block diagram of a storage system including a read channel having pre-assembly media sector alignment circuitry in accordance with one or more embodiments of the present inventions.

Turning to FIG. 2, a storage system 200 is shown that includes a read channel 210 having pre-assembly media sector alignment circuitry in accordance with one or more embodiments of the present invention. In addition to read channel 210, storage system 200 includes a read/write head 276, a preamplifier circuit 270, an interface controller 220, a hard disk controller 266, a motor controller 268, a spindle motor 272, and a disk platter 278. Storage system 200 may be, for example, a hard disk drive. Read/write head 276 includes one or more read heads distributed at different locations along the read/write head, and at least one write head. Interface controller 220 controls addressing and timing of data to/from disk platter 278, and interacts with a host controller (not shown). The data on disk platter 278 consists of groups of magnetic signals that may be detected by read/write head assembly 276 when the assembly is properly positioned over disk platter 278. In one embodiment, disk platter 278 includes magnetic signals recorded in accordance with either a longitudinal or a perpendicular recording scheme.

In a typical read operation, read/write head 276 is accurately positioned by motor controller 268 over a desired data track on disk platter 278. Motor controller 268 both positions read/write head 276 in relation to disk platter 278 and drives spindle motor 272 by moving read/write head assembly 276 to the proper data track on disk platter 278 under the direction of hard disk controller 266. Spindle motor 272 spins disk platter 278 at a determined spin rate (RPMs). Once read/write head 276 is positioned adjacent the proper data track, magnetic signals representing data on disk platter 278 are sensed by each of the sensors included in three sensor read/write head 276 as disk platter 278 is rotated by spindle motor 272. The sensed magnetic signals are provided as a continuous, minute analog signal representative of the magnetic data on disk platter 278 with a signal stream being provided from each read head. This minute analog signal is transferred from read/write head 276 to read channel circuit 210 via preamplifier 270. Preamplifier 270 is operable to amplify the individual minute analog signal accessed from disk platter 278. In turn, read channel circuit 210 processes the amplified signal including performing alignment on the media sector prior to assembling the data into individual codewords using a forced sync mark where the first sync mark is missed. This process is done to recreate the information originally written to disk platter 278. This data is provided as read data 203 to a receiving circuit. A write operation is substantially the opposite of the preceding read operation with write data 201 being provided to read channel circuit 210. This data is then encoded and written to disk platter 278. The data alignment on the media sector may be done using the circuit discussed below in relation to FIG. 3 and/or the method discussed below in relation to FIGS. 4a-4b.

It should be noted that storage system 200 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 200, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 210 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 200 may be modified to include solid state memory that is used to store data in addition to the storage offered by disk platter 278. This solid state memory may be used in parallel to disk platter 278 to provide additional storage. In such a case, the solid state memory receives and provides information directly to read channel circuit 210. Alternatively, the solid state memory may be used as a cache where it offers faster access time than that offered by disk platted 278. In such a case, the solid state memory may be disposed between interface controller 220 and read channel circuit 210 where it operates as a pass through to disk platter 278 when requested data is not available in the solid state memory or when the solid state memory does not have sufficient storage to hold a newly written data set. Based upon the disclosure provided herein, one of ordinary skill in the art will recognize a variety of storage systems including both disk platter 278 and a solid state memory.

Figure 3:
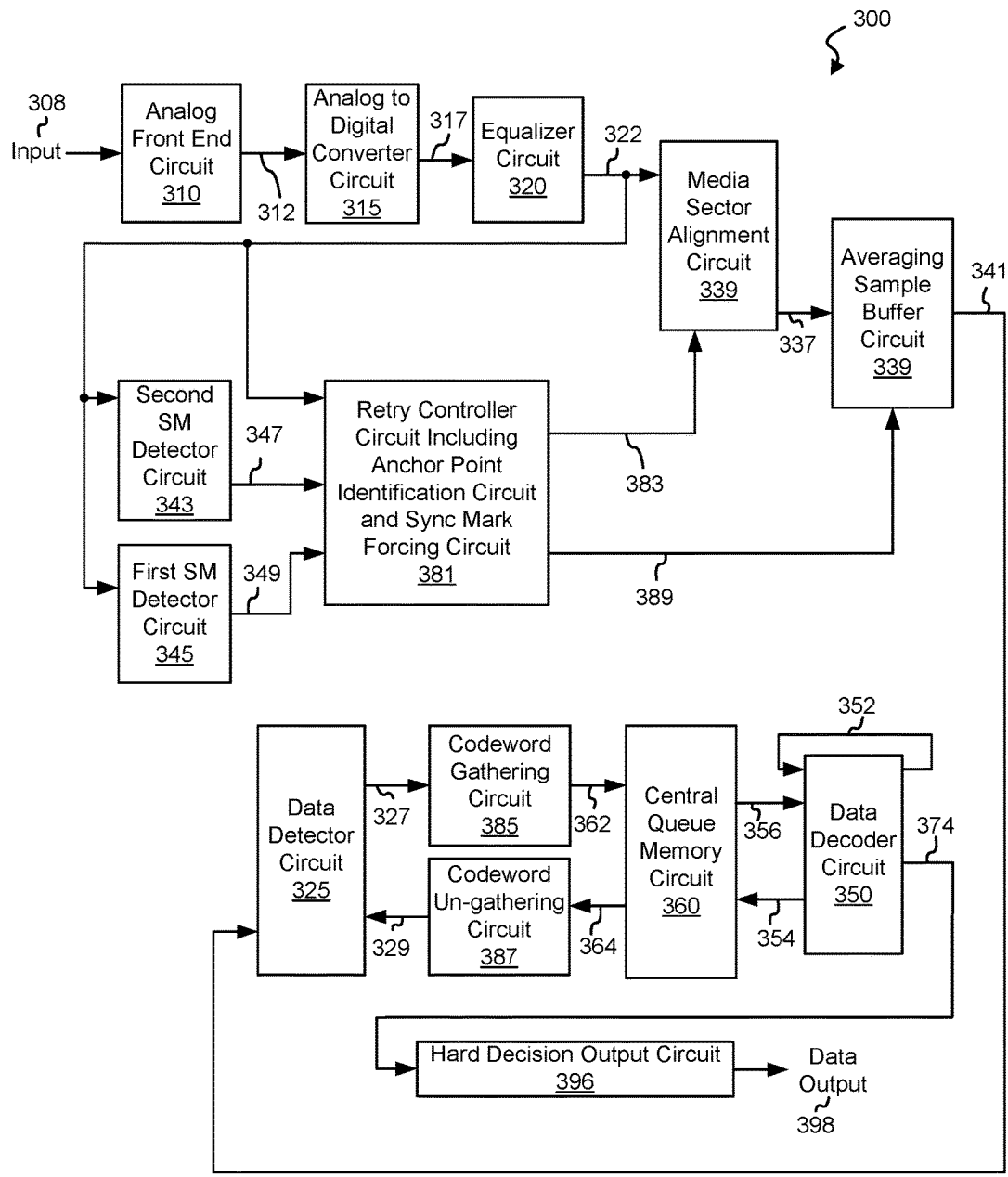
FIG. 3 shows a data processing circuit including pre-assembly media sector alignment circuitry in accordance with some embodiments of the present inventions.

Turning to FIG. 3, a data processing circuit 300 including pre-assembly media sector alignment circuitry in accordance with some embodiments of the present inventions. Data processing circuit 300 includes an analog front end circuit 310 that receives an analog signal 308. Analog front end circuit 310 processes analog signal 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input signal 308 is derived from a read/write head assembly (not shown) that is disposed in relation to a storage medium (not shown). Based upon the disclosure provided herein, one of ordinary skill in the art will recognize a variety of source from which analog input signal 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 317 are provided to an equalizer circuit 320 that equalizes the received data and provides an equalized output 322. Equalized output 322 is provided to a media sector alignment circuit 335 that aligns the data based upon an alignment signal 383. As more fully discussed below in relation to the discussion of alignment circuit 335, alignment signal 383 is generated based upon the location of a first sync mark and/or a second sync mark included as overhead in a received media sector.

Figure 5:
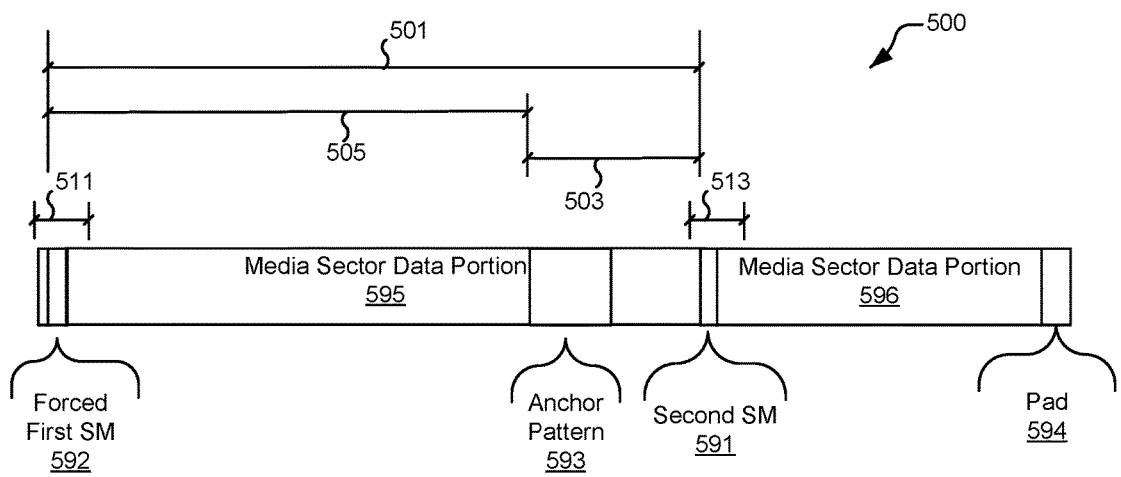
FIG. 5 is a graphical representation used to facilitate an understanding of the systems and methods discussed in relation to FIGS. 3, 4a, 4b.

Equalized output 322 is additionally provided to a first sync mark detector circuit 345, a second sync mark detector circuit 343, and a retry controller circuit 381. Retry controller circuit 381 includes an anchor point identification circuit and a sync mark forcing circuit. First sync mark detector circuit 345 continuously looks for predefined sync mark patterns (i.e., a first sync mark pattern and a second sync mark pattern) within equalized output. As each of the predefined sync mark patterns is identified within a respective synchronization window where the first sync mark or second sync mark are expected, first sync mark detection circuit 345 provides an indication of the identified sync mark as a first sync found output 349 to retry controller circuit 381 (indicating in turn the occurrence of the first sync mark and the second sync mark). In contrast, second sync mark detector circuit 343 looks for a predefined sync mark pattern corresponding to the second sync mark within equalized output. When the predefined sync mark pattern is identified within a synchronization window where the second sync mark is expected, second sync mark detection circuit 343 provides an indication of the identified sync mark as a second sync found output 347 to retry controller circuit 381. Turning to FIG. 5, a graphical representation 500 of an example equalized output is shown including a first synchronization window 511 spanning a period where a first sync mark pattern is expected to be found in the equalized output, and a second synchronization window 513 spanning a period where a second sync mark pattern is expected to be found in the equalized output.

Returning to FIG. 3, as first sync mark detector circuit 345 operates on the data in real time as it is received and second sync mark detector circuit 343 operates on previously buffered data in a retry scenario, the sync mark detection algorithm applied by second sync mark detector circuit 343 is more robust than the sync mark detection algorithm applied by first sync mark detector circuit 345. Based upon the disclosure provided herein, one of ordinary skill in the art will recognize a variety of sync mark detector circuits that may be used in relation to different embodiments.

In operation, when retry controller circuit 381 receives the first sync found output 349 indicating that at least one of the first sync mark or the second sync mark has been identified within a respective synchronization window, the location of the first sync mark is generated by retry controller circuit 381 and provided as an alignment signal 383 to media sector alignment circuit 335.

Alternatively, where neither the first sync mark nor the second sync mark are identified by the first sync mark detector circuit 345 as indicated by first sync found output 349, the anchor point identification circuit included in retry controller circuit 381 identifies a suitable anchor point within equalized output 322. In particular, the anchor point identification circuit identifies an area of the media sector that is outside of the two synchronization windows (i.e., the first synchronization window and the second synchronization window) that is sufficiently unique to be reliably re-detected on a re-read of the media sector. This anchor point may be a defined number of elements of the equalized output that are unique within the media sector and do not exhibit a high correlation to a subsequent defined number of bits that are shifted, for example, by one bit position (i.e., the subsequent pattern includes all but n-bits of the prior pattern plus n-additional new bit either preceding or following the unique pattern). Such an anchor point offers a repeatable location within the media sector at a defined distance from the second sync mark. Based upon the disclosure provided herein, one of ordinary skill in the art will recognize a variety of anchor point identification processes, systems, and/or circuits that may be used in relation to different embodiments to identify an anchor point within the media sector. Turning to FIG. 5, graphical representation 500 includes an identified anchor pattern 593 within a media sector data portion 595 that is located a distance 503 from a second sync mark 591. In this case, the anchor point is identified as the beginning of anchor pattern 593 with the distance from second sync mark 591 being calculated from the beginning of anchor pattern 593 to the beginning of second sync mark 591. Of note, the anchor pattern may alternatively be identified in a media sector data portion 596 that follows second sync mark 591. The sync mark forcing circuit included in retry controller circuit 381 calculates a location of the missed first sync mark based upon a combination of the location of the second sync mark as indicated by sync found output 347 and the location of the identified anchor point. This calculated location of the first sync mark is used to force a first sync mark on a subsequent re-read of the media data sector, and this location of the forced first sync mark is provided as alignment signal 383 to media sector alignment circuit 335. In particular, the distance from the first sync mark to the second sync mark is known and the distance between the second sync mark and the identified anchor point is calculated based upon the number of bit cycles between the two. Based upon these two known distances, the distance from the anchor point to the first sync mark can be calculated, and the first sync mark retroactively forced when retry controller circuit 381 identifies the anchor point in a subsequent re-read of the media sector. Using the example of FIG. 5, a distance 505 from where the first sync mark should have been found to the anchor point (i.e., the location of anchor pattern 593) is calculated as the known distance 501 from the second sync mark 591 to where the first sync mark was expected less distance 503. This distance 505 become the location where sync mark is forced (i.e., placed in the equalized data or simply indicated as found) as a forced sync mark 592 during a later read of the data corresponding to the equalized output.

Media sector alignment circuit 339 aligns equalized output 322 based upon alignment signal 383, and provides the resulting aligned data as an aligned equalized output 337 to an averaging sample buffer circuit 339. For a first read of the media sector or a first re-read of the media sector caused by a failure to identify the first sync mark, averaging sample buffer circuit 339 merely stores aligned equalized output 337 as an averaged equalized output 341. On the other hand, for a second or later re-read of the media sector, averaging sample buffer circuit 339 averages the previously stored averaged equalized output 341 with the newly received aligned equalized output 337 to update averaged equalized output 341. Retry controller circuit 381 monitors the re-read count and provides an average select output 389 to averaging sample buffer circuit 339 indicating the event of a second or later re-read where averaging is desired.

Averaged equalized output 341 is provided to a data detector circuit 325. Data detector circuit 325 is a data detector circuit capable of producing a detected output 327 by applying a data detection algorithm to a data input. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Data detector circuit 325 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a codeword gathering circuit 385 that identifies all of the codeword fragments distributed at known locations throughout the media sector represented by detected output 327. Codeword gathering circuit 385 then un-shuffles (i.e., the shuffling originally applied to the fragments to distribute them across the media sector is reversed) the identified codeword fragments and arranges them to yield a representation of each of the individual codewords included within the media sector. The re-assembled individual codewords are provided as a codeword output 362 to a central queue memory circuit 360 that operates to buffer data passed between data detector circuit 325 and data decoder circuit 350. When data decoder circuit 350 is available, data decoder circuit 350 receives codeword output 362 as a decoder input 356.

Data decoder circuit 350 applies a data decoding algorithm to decoder input 356 in an attempt to recover originally written data. The result of the data decoding algorithm is provided as a decoded output 354. Similar to detected output 327, decoded output 354 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check decoder circuit or a turbo code decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, data decoder circuit 350 provides the result of the data decoding algorithm as a data output 374. Data output 374 is provided to a hard decision output circuit 396 where the data is reordered before providing a series of ordered data sets as a data output 398.

One or more iterations through the combination of data detector circuit 325 and data decoder circuit 350 may be made in an effort to converge on the originally written data set. Processing through both the data detector circuit and the data decoder circuit is referred to as a "global iteration", and processing through only data decoder circuit is referred to as a "local iteration". For the first global iteration, data detector circuit 325 applies the data detection algorithm without guidance from a decoded output. For subsequent global iterations, data detector circuit 325 applies the data detection algorithm to buffered data as guided by decoded output 354. A derivative of decoded output 354 is received from central queue memory 360 as a detector input 329. In particular, detector input 329 is decoded output 354 after having been re-fragmented and re-shuffled to yield a decoded output arranged consistent with detected output 327. This re-arranged decoded output is then used a guide to the re-application of the data detection algorithm by data detector circuit 325.

During each global iteration it is possible for data decoder circuit 350 to make one or more local iterations including application of the data decoding algorithm to decoder input 356. For the first local iteration, data decoder circuit 350 applies the data decoder algorithm without guidance from a decoded output 352. For subsequent local iterations, data decoder circuit 350 applies the data decoding algorithm to decoder input 356 as guided by a previous decoded output 352. In some embodiments of the present invention, a default of ten local iterations is allowed for each global iteration.

Figure 4A:
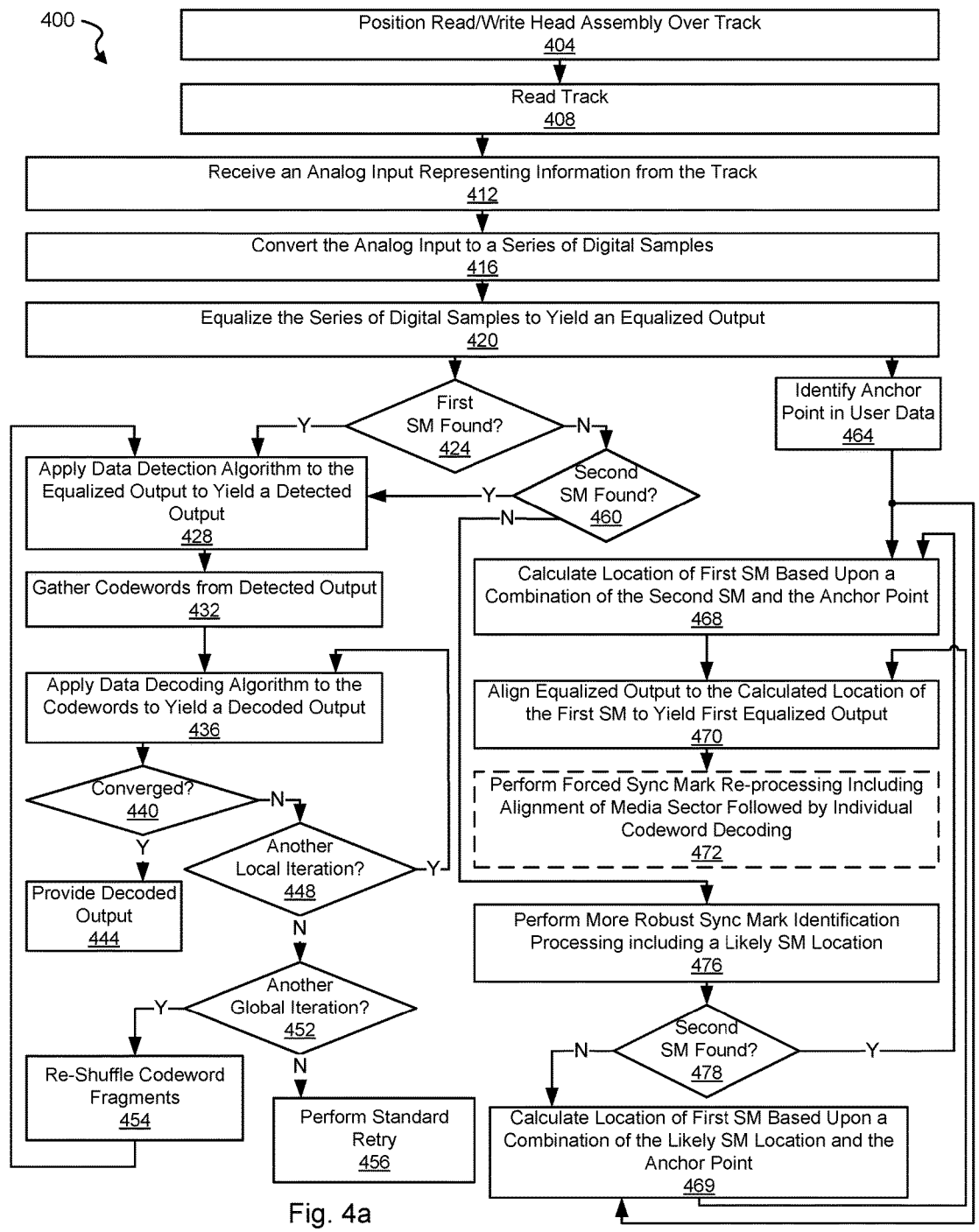
FIGS. 4a-4b are flow diagrams showing a method for pre-assembly media sector alignment in accordance with various embodiments of the present invention.
Figure 4B:
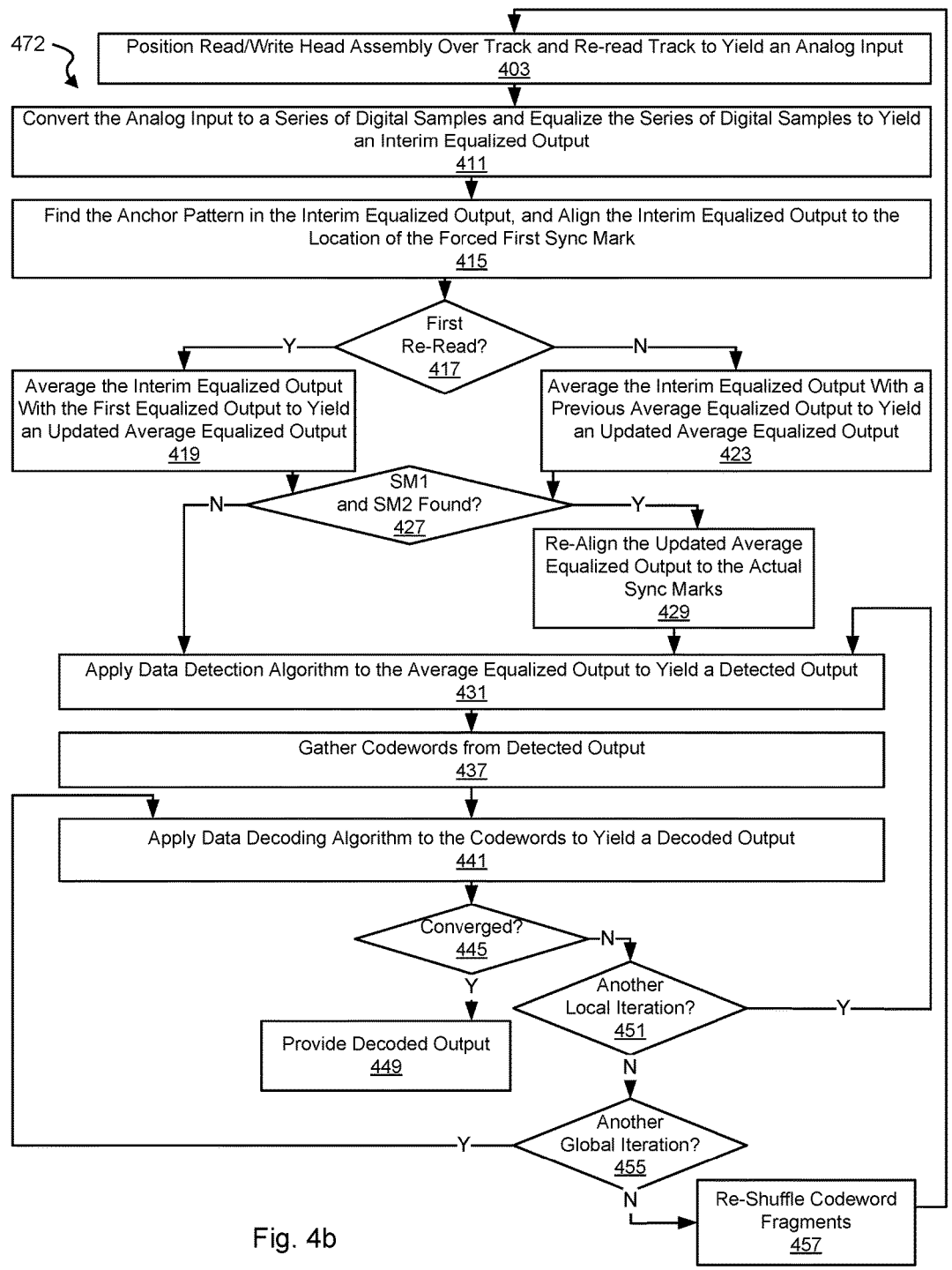

Turning to FIGS. 4a-4b, a flow diagram 400 and a flow diagram 472 show a method for pre-assembly media sector alignment in accordance with various embodiments of the present invention. Turning to FIG. 4a and following flow diagram 400, a read/write head assembly is positioned over a desired track of a storage medium (block 404). This positioning may be done using any approach known in the art for head positioning. In some cases, the head positioning is done using information from servo wedges on the storage medium. With the read/write head assembly positioned over the desired track, information on the track is sensed by a read sensor included within the read/write head assembly (block 408). This reading process yields a continuous analog input representing the data stored on the track of the storage medium as the storage medium rotates in relation to the read/write head assembly (block 412).

The continuous analog input is converted into a series of digital samples (block 416). The series of digital samples may be generated using any circuit known in the art that is capable of providing a digital representation of an analog signal at different slices in time. An equalization algorithm is applied to the series of digital samples to yield an equalized output (block 420). In some embodiments, the equalization algorithm is applied by a digital finite impulse response filter circuit (FIR) as is known in the art. Based upon the disclosure provided herein one of ordinary skill in the art will recognize a variety of equalization algorithms and/or equalizer circuits or systems that may be used in relation to different embodiments to equalize the series of digital samples.

During a synchronization window the equalized data is processed to detect a first sync mark pattern. This synchronization window surrounds a location in the track where the first sync mark is expected to occur, and later a synchronization window surrounds a location where the second sync mark is expected to occur. Turning to FIG. 5, graphical representation 500 of an example equalized output is shown including first synchronization window 511 spanning a period where a first sync mark pattern is expected to be found in the equalized output. As this is the first sync mark pattern which may include a preceding preamble, a relatively robust sync mark identification process may be used to identify a sync mark when compared with a less robust sync mark identification process used to perform real time identification of a later, second sync mark pattern.

Returning to FIG. 4a, it is determined whether the first sync mark pattern was received within the synchronization window (block 424). Where the first sync mark was found within the synchronization window (block 424), standard processing is performed. This standard processing includes applying a data detection algorithm to the equalized output using the alignment defined by the location of the first sync mark to yield a detected output (block 428). In some embodiments, the data detection algorithm is a maximum a posteriori data detection algorithm. Based upon the disclosure provided herein, one of ordinary skill in the art will recognize other data detection algorithms that can be used in relation to different embodiments of the present invention.

The codewords included in the detected output (e.g., the codewords that were originally included in a media sector) are gathered together (block 432). This gathering process includes identifying all of the codeword fragments distributed at known locations throughout the media sector represented by the detected output. The identified codeword fragments are then un-shuffled (i.e., the shuffling originally applied to the fragments to distribute them across the media sector is reversed) and arranged to yield a representation of each of the individual codewords included within the media sector.

A data decoding algorithm is then applied to the individual codewords to yield a decoded output (block 436). In some embodiments, the individual codewords are low density parity check (LDPC) codewords, and the data decoding algorithm is an LDPC decoding algorithm. Based upon the disclosure provided herein, one of ordinary skill in the art will recognize other data encoding and decoding algorithms that can be used in relation to different embodiments of the present invention.

It is determined whether the data decoding algorithm converged (block 440). Such convergence occurs where the codewords were properly decoded to yield the originally encoded user data. Where the data decoding algorithm converged (block 440), the decoded output is provided and the recovery process for the currently processing media sector is complete (block 444). Alternatively, where the data decoding algorithm failed to converge (block 440), it is determined whether another local iteration (i.e., anther application of the data decoding algorithm) is desired (block 448). In some embodiments, ten local iterations for each global iteration (i.e., application of both the data detection algorithm and the data decoding algorithm) are allowed. Based upon the disclosure provided herein, one of ordinary skill in the art will recognize other limits on how many local iterations may be performed in accordance with different embodiments of the present invention. Where another local iteration is allowed or desired (block 448), the processes of blocks 436-448 are repeated using the current decoded output as a guide for the next local iteration.

Where, on the other hand, another local iteration is not desired (block 448), it is determined whether another global iteration is desired (block 452). In some embodiments, seven global iterations are allowed. Based upon the disclosure provided herein, one of ordinary skill in the art will recognize other limits on how many global iterations may be performed in accordance with different embodiments of the present invention. Where another global iteration is desired (block 452), the individual codewords are re-fragmented, and the fragments are re-shuffled to yield a decoded output arranged consistent with the detected output (block 454). This re-arranged decoded output is then used as a guide to the re-application of the processes of blocks 428-456 for the next global iteration. Alternatively, where another global iteration is not desired (block 452), the data recovery process has failed and some standard form of retry processing is performed (block 456). This standard form of retry processing may include, but is not limited to, processing across multiple reads where the digital samples are averaged with corresponding samples from previous reads of the same data to reduce the impact of noise. Based upon the disclosure provided herein, one of ordinary skill in the art will recognize a variety of retry processes that may be used in accordance with different embodiments to recover data corresponding to the failed media sector.

In contrast, where the first sync mark is not found within the synchronization window (block 424), it is determined whether the second sync mark is found within a synchronization window where the second sync mark is expected (block 460). The synchronization window for the second sync mark surrounds a location in the track where the second sync mark is expected to occur. Turning to FIG. 5, graphical representation 500 includes second synchronization window 513 spanning a period where a second sync mark pattern is expected to be found in the equalized output. Again, this second sync mark pattern may not be subject to the same robust sync mark identification process that was applied to finding the first sync mark. Where the second sync mark is found (block 460), the processes of blocks 428-456 are performed using the location of the second sync mark to align the data being processed.

Returning to FIG. 4a, in parallel while the equalized output is being processed, an anchor point is identified within an area of the media sector that is outside of the two synchronization windows (block 464). This anchor point may be a defined number of elements of the equalized output that are unique within the media sector and do not exhibit a high correlation to a subsequent defined number of bits that are shifted, for example, by one bit position (i.e., the subsequent pattern includes all but one bit of the prior pattern plus one additional new bit). Such an anchor point offers a repeatable location within the media sector at a defined distance from the second sync mark. Based upon the disclosure provided herein, one of ordinary skill in the art will recognize a variety of anchor point identification processes, systems, and/or circuits that may be used in relation to different embodiments to identify an anchor point within the media sector. Turning to FIG. 5, graphical representation 500 includes identified anchor pattern 593 within media sector data portion 595 that is located distance 503 from second sync mark 591. In this case, the anchor point is identified as the beginning of anchor pattern 593 with the distance from second sync mark 591 being calculated from the beginning of anchor pattern 593 to the beginning of second sync mark 591. Of note, the anchor pattern may alternatively be identified in a media sector data portion 596 that follows second sync mark 591.

Alternatively, where the second sync mark is not found (block 460), a more robust sync mark identification algorithm is applied to the equalized data corresponding to the synchronization window around where the second sync mark was expected in an effort to identify the location of the second sync mark (block 476). Even where a portion of data is not identified as the second sync mark, the more robust sync mark identification produces at least one location indicating a likely location of the second sync mark. For example, the sync mark detection may include performing a running comparison of the received data with a predefined sync mark pattern to determine a level of correlation between the data and the predefined sync mark pattern. The level of correlation is compared with a threshold, and where the threshold is met, a sync mark has been identified and the location is identified as the actual sync mark pattern. Where during the second synchronization window the threshold is not met, the location within the window that comes closest to meeting the threshold is identified as a likely sync mark location. As another example, the likely sync mark location may be a pre-programmed guess.

Where the second sync mark was identified using the more robust sync mark detection (block 478), the location of the actual second sync mark is stored and the location of the first sync mark is calculated based upon a combination of the location of the actual second sync mark and the identified anchor point (block 468). In particular, the distance from the first sync mark to the second sync mark is known and the distance between the second sync mark and the identified anchor point is calculated based upon the number of bit cycles between the two. Based upon these two known distances, the distance from the anchor point to the first sync mark can be calculated. Using the example of FIG. 5, a distance 505 from where the first sync mark should have been found to the anchor point (i.e., the location of anchor pattern 593) is calculated as the known distance 501 from the second sync mark 591 to where the first sync mark was expected less distance 503. This distance 505 become the location where sync mark is forced (i.e., placed in the equalized data or simply indicated as found) as a forced sync mark 592 during a later read of the data corresponding to the equalized output. The equalized output which is buffered is aligned to the calculated location of the first sync mark to yield a first equalized output.

Once the location of where the first sync mark is to be forced has been determined, forced sync mark re-processing is performed which includes alignment of the media sector followed by individual codeword decoding (block 472). Such forced sync mark re-processing includes re-reading the track where the first sync mark was missed and aligning the data with the calculated location of the first sync mark relative to the anchor point. A flow diagram 472 discussed below in relation to FIG. 4b sets forth an example of block 472 in greater detail.

Alternatively, where the second sync mark is not found using the more robust sync mark identification processing (block 478), a likely location of the second sync mark is stored and the location of the first sync mark is calculated based upon a combination of the likely location of the second sync mark and the identified anchor point (block 469). In particular, the distance from the first sync mark to the second sync mark is known and the distance between the likely location of the second sync mark and the identified anchor point is calculated based upon the number of bit cycles between the two. Based upon these two known distances, the distance from the anchor point to the first sync mark can be calculated. Using the example of FIG. 5, a distance 505 from where the first sync mark should have been found to the anchor point (i.e., the location of anchor pattern 593) is calculated as the known distance 501 from the second sync mark 591 to where the first sync mark was expected less distance 503. This distance 505 become the location where sync mark is forced (i.e., placed in the equalized data or simply indicated as found) as a forced sync mark 592 during a later read of the data corresponding to the equalized output. The equalized output which is buffered is aligned to the calculated location of the first sync mark to yield a first equalized output.

Once the location of where the first sync mark is to be forced has been determined, forced sync mark re-processing is performed which includes alignment of the media sector followed by individual codeword decoding (block 472). Such forced sync mark re-processing includes re-reading the track where the first sync mark was missed and aligning the data with the calculated location of the first sync mark relative to the anchor point. A flow diagram 472 discussed below in relation to FIG. 4b sets forth an example of block 472 in greater detail.

Turning to FIG. 4b, a flow diagram 472 shows a detailed method for the block of the same number in FIG. 4a. Following flow diagram 472, the read/write head assembly is again positioned over the desired track and the track is re-read to yield an analog input (block 403). The analog input is converted into a series of digital samples, and the series of digital samples is equalized to yield an interim equalized output (block 411). The aforementioned re-read includes a re-read of all codeword fragments within a media sector impacted by a missed first sync mark.

Once the interim equalized output is complete, a search is performed to find the anchor pattern (i.e., the pattern that was identified as an anchor pattern and used to establish the anchor point in block 464 of FIG. 4a) within the interim equalized data, and using the re-identified location of the anchor pattern (i.e., the anchor point) the interim equalized output is aligned to the location of a forced sync mark (i.e., the previously calculated location where the first sync mark should have occurred) (block 415). By doing this, the entirety of the media sector is re-aligned to the forced interim sync mark, thus eliminating the complexity involved in aligning individual codewords.

It is determined if it is the first re-read of the media sector from the track (block 417). Where it is the first re-read (block 417), the interim equalized output is averaged with the first equalized output from block 470 to yield an updated average equalized output (block 419). Alternatively, where it is a second or later re-read of the track (block 417), the interim equalized output is averaged with the prior instance of the average equalized output from either block 419 or block 423 to yield an newly updated average equalized output (block 423).

A sync mark detection is applied within synchronization windows corresponding to the first sync mark and second sync mark to determine whether both the first sync mark and the second sync mark can be identified (block 427). Because the updated average equalized output is buffered, in some cases, both the first and second sync marks are searched in parallel. Further, because the updated average equalized output is buffered, a more thorough yet more time consuming sync mark detection algorithm may be used as the constraints of the timing of the received data does not dictate a fast sync mark detection operation. Where the first sync mark and the second sync mark were found within the respective synchronization windows (block 427), the updated average equalized output is re-aligned to the actual first sync mark and second sync mark to the extent the alignment is different from that achieved using the forced first sync mark (block 429). The finding of the actual sync mark and corresponding re-alignment of the data to the actual sync mark is particularly useful where only the likely location of the second sync mark was originally used for calculating the location where the first sync mark was forced.

Whether or not the updated equalized output is re-aligned using the actual sync mark(s) or continues with the original alignment achieved by use of the forced first sync mark (block 427, 429), the data detection algorithm is applied to the updated average equalized output to yield a detected output (block 431). Again, in some embodiments the data detection algorithm is a maximum a posteriori data detection algorithm. Based upon the disclosure provided herein, one of ordinary skill in the art will recognize other data detection algorithms that can be used in relation to different embodiments of the present invention.

The codewords included in the detected output (e.g., the codewords that were originally included in a media sector) are gathered together (block 437). This gathering process includes identifying all of the codeword fragments distributed at known locations throughout the media sector represented by the detected output. The identified codeword fragments are then un-shuffled (i.e., the shuffling originally applied to the fragments to distribute them across the media sector is reversed) and arranged to yield a representation of each of the individual codewords included within the media sector.

A data decoding algorithm is then applied to the individual codewords to yield a decoded output (block 441). Again, in some embodiments the individual codewords are low density parity check (LDPC) codewords, and the data decoding algorithm is an LDPC decoding algorithm. Based upon the disclosure provided herein, one of ordinary skill in the art will recognize other data encoding and decoding algorithms that can be used in relation to different embodiments of the present invention.

It is determined whether the data decoding algorithm converged (block 445). Where the data decoding algorithm converged (block 445), the decoded output is provided and the recovery process for the currently processing media sector is complete (block 449). Alternatively, where the data decoding algorithm failed to converge (block 445), it is determined whether another local iteration is desired (block 451). Again, in some embodiments ten local iterations for each global iteration are allowed. Based upon the disclosure provided herein, one of ordinary skill in the art will recognize other limits on how many local iterations may be performed in accordance with different embodiments of the present invention. Where another local iteration is allowed or desired (block 451), the processes of blocks 431-445 are repeated using the current decoded output as a guide for the next local iteration.

Where, on the other hand, another local iteration is not desired (block 451), it is determined whether another global iteration is desired (block 455). Again, in some embodiments seven global iterations are allowed. Based upon the disclosure provided herein, one of ordinary skill in the art will recognize other limits on how many global iterations may be performed in accordance with different embodiments of the present invention. Where another global iteration is desired (block 455), the individual codewords are re-fragmented, and the fragments are re-shuffled to yield a decoded output arranged consistent with the detected output (block 457). This re-arranged decoded output is then used a guide to the re-application of the processes of blocks 431-445 for the next global iteration. Alternatively, where another global iteration is not desired (block 455), the data recovery process has failed and another retry iteration begins at block 403.

Alternatively, where the interim equalized output is not the result of a first re-read of the media sector (block 419), the interim equalized output is averaged with a previous average equalized output to yield an updated average equalized output (block 427), and the processes of blocks 431-455 are repeated. This process of repeatedly re-reading to recover the original user data included in the media data sector may be performed a defined number of times before a timeout condition is indicated.

Additionally, it should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent, albeit such a system would not be a circuit. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the system comprising:
a first sync mark detector circuit operable to apply a first sync mark detection algorithm to search a received media sector and overhead for a second sync mark after a failure to identify a first sync mark, wherein the received media sector includes a first fragment set corresponding to a first codeword, a second fragment set corresponding to a second codeword, and wherein the first fragment set is shuffled with the second fragment set to yield an intermixed fragment set;
a second sync mark detector circuit operable to apply a second sync mark detection algorithm to search the received media sector and overhead for the second sync mark, wherein the second sync mark detection algorithm is more robust than the first sync mark detection algorithm;
an anchor point identification circuit operable to identify an anchor point in the received media sector;
a retry controller circuit operable to cause a re-read of the received media sector and overhead when the first sync mark detector circuit fails to identify the first sync mark, and to align the received media sector to a forced sync mark at a location calculated based upon a first location of the anchor point and a second location of the second sync mark to yield an aligned media sector; and
a data processing circuit operable to recover an original user data set from the aligned media sector.

2. The data processing system of claim 1, wherein the data processing system is implemented as part of a storage device.

3. The data processing system of claim 1, wherein the data processing system is implemented as part of an integrated circuit.

4. The data processing system of claim 1, wherein the second location of the of the second sync mark is selected from a group consisting of an actual location where the second sync mark was identified, and a likely location of the second sync mark.

5. The data processing system of claim 1, wherein the first sync mark detection algorithm uses both the first sync mark and a preceding preamble pattern, and wherein the second sync mark detection algorithm uses only the second sync mark.

6. The data processing system of claim 1, wherein the data processing circuit comprises:
a data detector circuit operable to apply a data detection algorithm to an equalized output corresponding to the aligned media sector to yield a detected output;
a codeword gathering circuit operable to un-shuffle the intermixed fragment set represented by the detected output to yield the first codeword and the second codeword; and a data decoder circuit operable to apply a data decoding algorithm to the first codeword and the second codeword.

7. The data processing system of claim 6, wherein the data detection algorithm is selected from a group consisting of a Viterbi data detection algorithm, and a maximum a posteriori data detection algorithm.

8. The data processing system of claim 6, wherein the data decoding algorithm is a low density parity check decoding algorithm.

9. The data processing system of claim 1, wherein identifying the anchor point within the media sector includes identifying a first data pattern within the received media sector that is unique within the received media sector and does not exhibit a strong correlation to a second data pattern in the received media sector that includes all but n-bits of the first data pattern plus n-additional consecutive bits, wherein n is an integer value.

10. The data processing system of claim 9, wherein the first data pattern does not include the first sync mark or the second sync mark.

11. The data processing system of claim 1, wherein the first sync mark and the second sync mark each include different data patterns.

12. A method for data processing, the method comprising:
receiving a media sector including a first fragment set corresponding to a first codeword, a second fragment set corresponding to a second codeword, wherein the first fragment set is shuffled with the second fragment set to yield an intermixed fragment set;
failing to identify both a first sync mark and a second sync mark associated with the media sector;
identifying an anchor point within the media sector at an anchor location;
using a sync mark identification circuit to re-identify the second sync mark at a second sync mark location, wherein the second sync mark location is selected from a group consisting of an actual location where the second sync mark was identified, and another likely location of the second sync mark;
using the anchor location and the second sync mark location to calculate a first sync mark location;
re-reading the entire media sector to yield a re-read media sector, and aligning the entire re-read media sector to the first sync mark location to yield an aligned media sector; and
processing the aligned media sector using a data detector circuit and a data decoder circuit to yield user data, wherein the user data was originally encoded to yield the first codeword and the second codeword.

13. The method of claim 12, wherein the failing to identify both the first sync mark and the second sync mark associated with the media sector is done by a first sync mark detector circuit operable to apply a first sync mark detection algorithm and a second sync mark detector circuit operable to apply a second sync mark detection algorithm, the second sync mark detection algorithm is more robust than the first sync mark detection algorithm.

14. The method of claim 12, wherein processing the aligned media sector comprises:
using the data detector circuit to apply a data detection algorithm to an equalized output corresponding to the aligned media sector to yield a detected output;
un-shuffling the intermixed fragment set represented by the detected output to yield the first codeword and the second codeword; and
using the data decoder circuit to apply a data decoding algorithm to the first codeword and the second codeword.

15. The method of claim 14, wherein the data detection algorithm is selected from a group consisting of a Viterbi data detection algorithm, and a maximum a posteriori data detection algorithm.

16. The method of claim 14, wherein the data decoding algorithm is a low density parity check decoding algorithm.

17. The method of claim 12, wherein identifying the anchor point within the media sector comprises:
identifying a first data pattern within the media sector that is unique within the media sector and does not exhibit a strong correlation to a second data pattern which includes all but n-bits of the first data pattern plus n-additional consecutive bits, wherein n is an integer value.

18. The method of claim 17, wherein the first data pattern does not include the first sync mark or the second sync mark.

19. The method of claim 12, wherein the first sync mark and the second sync mark each include a different data pattern.

20. The method of claim 12, wherein the method is performed in relation to a storage medium.

* * * * *